United States Patent [19]

Watanabe

[11] Patent Number: 4,478,678

[45] Date of Patent: Oct. 23, 1984

[54] METHOD OF REACTIVE ION ETCHING MOLYBDENUM AND MOLYBDENUM SILICIDE

[75] Inventor: Tohru Watanabe, Tokyo, Japan

[73] Assignee: Tokyo Shibaura Denki Kabushiki Kaisha, Kanagawa, Japan

[21] Appl. No.: 584,530

[22] Filed: Feb. 28, 1984

[30] Foreign Application Priority Data

Mar. 7, 1983 [JP] Japan .................................. 58-36924

[51] Int. Cl.$^3$ ........................ B44C 1/22; C03C 15/00; C03C 25/06; C23F 1/02
[52] U.S. Cl. .................................... 156/643; 156/646; 156/657; 156/659.1; 204/192 E; 252/79.1
[58] Field of Search ............... 156/643, 646, 657, 656, 156/659.1, 662, 664; 427/38, 39; 430/313; 204/192 E, 192 EC; 252/79.1

[56] References Cited

U.S. PATENT DOCUMENTS 4,411,734 10/1983 Maa .................................. 156/651 X
4,444,617 4/1984 Whitcomb ........................... 156/643

Primary Examiner—William A. Powell
Attorney, Agent, or Firm—Banner, Birch, McKie & Beckett

[57] ABSTRACT

The method of reactive ion etching molybdenum or molybdenum silicide includes the steps of placing a sample to be etched on one of two opposed electrodes in a vacuum chamber, charging an etching gas into the chamber, applying high frequency electrical power to the electrodes to generate a discharge between them, and etching the exposed portion of the sample. The gas is a mixture of chlorine and oxygen, with the oxygen flow rate being less than about 30% of the total flow rate of the mixture.

8 Claims, 7 Drawing Figures

METHOD OF REACTIVE ION ETCHING MOLYBDENUM AND MOLYBDENUM SILICIDE

BACKGROUND OF THE INVENTION

This invention generally relates to a method of reactive ion etching for the manufacture of semiconductor integrated circuits, and more particularly to a method of reactive ion etching which is useful for fine processing of molybdenum (Mo) and molybdenum silicide, which may be used for the gate material and the wiring material of integrated circuits.

As the density of integration is increased, the electrical resistance of silicon gates and wiring become significant because their cross-sectional areas are greatly decreased. From another point of view, gate and wiring material is required to withstand high temperatures (about 1273 K.) for presently-used processes of integrated circuit manufacture. In recent years, in order to overcome such problems, molybdenum (Mo) and its silicon compound molybdenum silicide ($MoSi_2$), which are high-melting-point materials, have been used in place of Si. For processing these materials, reactive ion etching is employed, because it is faithful to the dimensions of the photoresist mask. At first, a mixture of $CF_4$ and $O_2$ gases was used in the reactive ion etching of molybdenum silicide. However, this mixture is not suitable for fine processing of this material because of the difficulty of avoiding undercutting (see FIG. 4B for an example of undercutting).

In recent years, reactive ion etching using a mixture of $CCl_4$ and $O_2$ gases has been reported, see K. Nishioka, et al., "Anisotropic Etching of $MoSi_2$/Poly-Si Double Layer Films with Chlorinated Gas Plasma," Proceedings of Symposium on Dry Process 1982, at 51. According to this report, since the reaction products are chlorides of molybdenum or silicon or compounds of molybdenum with chlorine and oxygen, if only $CCl_4$ is used, non-volatile carbon will accumulate on the surface of the molybdenum silicide and decrease the etch rate. Consequently, $O_2$ is added to $CCl_4$ in order to promote the etching by changing carbon into CO and $CO_2$, which are volatile. However, the range of permissible oxygen addition is limited, because if excess oxygen is added, this causes oxidation of the photoresist mask. Therefore, in the conventional method using $CCl_4$ and $O_2$, it is necessary to keep the $O_2$ flow rate below a certain level. As a result of this limitation, a certain degree of carbon accumulation on the surface of the molybdenum silicide is almost inevitable, and ion bombardment is required in order to remove the accumulated carbon.

Since the strength of ion bombardment varies inversely with the pressure of the gases, etching has to be carried out at a comparatively low pressure. But, the etch rates of photoresist and $SiO_2$ are mainly determined by the degree of ion bombardment. Accordingly, if etching is carried out at low gas pressure (a high level of ion bombardment), the etching selectivity ratio of molybdenum silicide over $SiO_2$ or photoresist decreases undesirably (because the etch rates of $SiO_2$ and photoresist increase). As the density of circuit integration increases, it has been necessary to make the gate oxide layer of $SiO_2$ proportionately thinner. So, when molybdenum silicide is used as the gate, this reduced etching selectivity ratio can be unsatisfactory.

SUMMARY OF THE INVENTION

The instant invention overcomes the above disadvantages by using a novel gas mixture as the etching gas. In particularly, the instant invention provides a method of reactive ion etching suitable for etching molybdenum and molybdenum silicide.

It is, therefore, an object of the invention to provide a method of reactive ion etching molybdenum or molybdenum silicide having a high etching selectivity ratio over photoresist or silicon dioxide ($SiO_2$).

It is a further object of the present invention to provide such a method of reactive ion etching having an etch rate sufficiently high to be of practical use.

It is another object of the present invention to provide such a method of reactive ion etching which produces an etched sample of vertical cross-section without undercutting (good anisotrophy), that is having an excellent processing shape characteristic.

It is a still further object of the present invention to provide such a method of reactive ion etching suitable for etching molybdenum and molybdenum silicide as gates and wiring of integrated circuits, when these are deposited over silicon dioxide insulating material.

This invention was made by first investigating the etching results when chlorine alone ($Cl_2$) was used as the etching gas and then attempting to overcome the resultant problems of $SiO_2$ and resist etching and undercutting of the Mo and $MoSi_2$.

Specifically, in this method of reactive ion etching, the sample has an exposed surface layer made of molybdenum (Mo) or molybdenum silicide ($MoSi_2$). The sample is placed in the vacuum chamber of a reactive ion etching apparatus on one of two opposing electrodes to which high-frequency electrical power can be applied. This invention is characterized in that, in etching selected portions of the Mo or $MoSi_2$ layer from the sample, a mixture of chlorine and oxygen is used as the etching gas that is introduced into the apparatus's vacuum chamber, the oxygen flow rate being less than about 30% of the total flow rate of etching gas (oxygen and chlorine).

DETAILED DESCRIPTION OF THE PREFERRED EMBODIMENT

Figure 1:
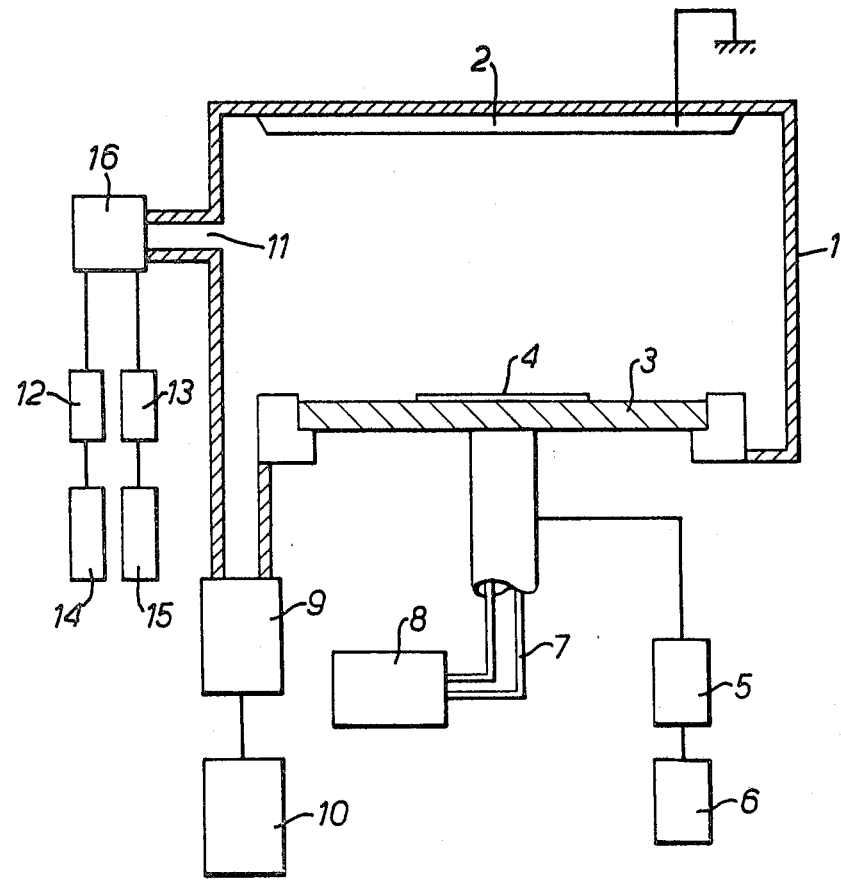
FIG. 1 is a schematic diagram of a reactive ion etching apparatus used for practicing one preferred embodiment of the invention.

FIG. 1 shows an example of a reactive ion etching apparatus used in practicing the present invention. Vacuum chamber 1 is coupled to exhaust system 10 and contains an upper electrode 2 and a lower electrode 3 opposing each other. Upper electrode 2 is grounded, while lower electrode 3 is connected to a source of high-frequency electrical power, radio frequency (RF) power source 6, through matching network 5 (for impedance matching). A sample to be etched is mounted on lower electrode 3. The apparatus also has a temperature regulator 8 for maintaining the temperature of lower electrode 3 at a constant value (an arbitrarily selected temperature between 273 K. and 323 K.) by circulating a heating medium, kept at a constant temperature, through circulation pipe 7 using a circulation pump (not shown). A pressure regulator 9 is provided between chamber 1 and the exhaust system 10 for keeping the pressure within chamber 1 constant. Chamber 1 has an inlet 11 for the introduction of etching gas. The etching gas is introduced from $Cl_2$ gas source 14 and $O_2$ gas source 15 through respective flow regulators 12 and 13 into chamber 1 via manifold 16 and inlet 11.

In this etching apparatus when RF power is applied to the lower electrode 3, the potential Vc of the lower electrode 3 is several tens to several hundreds of volts lower than the plasma potential Vp. This DC self-bias potential Vdc causes the positive (+) ions (cations) in the plasma to be accelerated, so that these ions bombard the surface of the sample.

In this embodiment, by measuring the potential difference between the potential Va of upper electrode 2 and the potential Vc of lower electrode 3, the self-bias voltage Vdc can be approximated, since the difference between the potential Va of the upper electrode and the potential Vp of the plasma is at the most several tens of volts. Therefore the potential Vdc will be taken as the difference between Va and Vc, in the following explanation.

Sample 4 which is to be etched is produced as follows. A 4-inch silicon wafer is oxidized by heat to a depth of 40-100 nm. Then molybdenum or molybdenum silicide is deposited, to a thickness of 400 nm, on the silicide dioxide layer by magnetron sputtering. Finally, the layer of molybdenum or molybdenum silicide is patterned by a positive-type photoresist.

Figure 2:
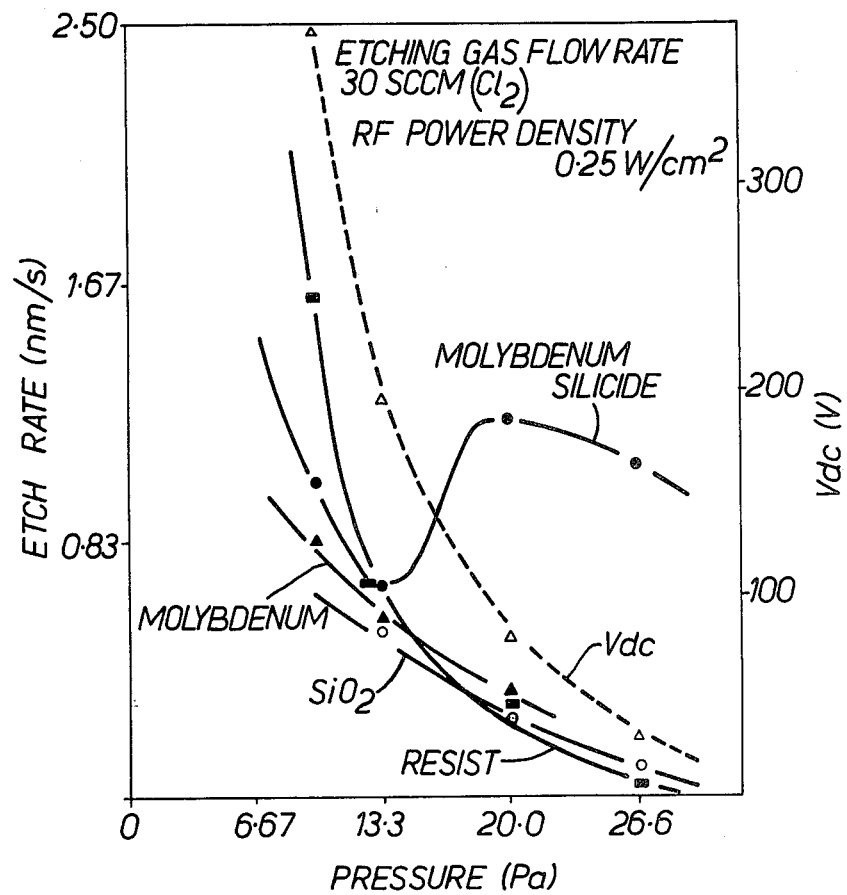
FIG. 2 is a graph showing etch rates, of $SiO_2$, photoresist, molybdenum, and molybdenum silicide as a function of pressure, and also a curve of self-bias voltages, when chlorine alone is used as the etching gas.

Referring to FIG. 2, the relationships between the etch rates of various materials and etching gas pressure are shown, as is the relationship between the self-bias voltage Vdc and the gas pressure. When the pressure of the gas is high, the self-bias voltage Vdc is low; and the etch rates of $SiO_2$ and of photoresist also decrease. Since the etch rate of these materials is determined primarily by ion bombardment, high gas pressure must be maintained in order to keep the etch rate of these materials as low as possible. On the other hand, the variation of the etch rate of molybdenum and molybdenum silicide is shown in FIG. 2. Anisotropic etching with a vertical cross-section is realized over a wide range of pressure (e.g., 6.7-40.0 Pa) in both cases. The reason for this excellent processing shape characteristic is believed to be as follows. In the case of molybdenum the layer of molybdenum produced by sputtering normally consists of pillar-shaped crystals perpendicular to the surface of the substrate; and since etching proceeds from structurally unstable grain boundaries, a vertical cross-sectional shape will tend to be produced. In the case of molybdenum silicide, satisfactory anistropy is achieved even in the pressure region in which a large undercut would occur with silicon. This effect is believed to be due to the presence of molybdenum. Namely, this is believed to prevent the undercutting which occurs if any reactive product is deposited on the side walls (discussed in detail below). The circumstances regarding this prevention of undercutting due to re-deposition on the side walls are the same as in the case of molybdenum.

Figure 3:
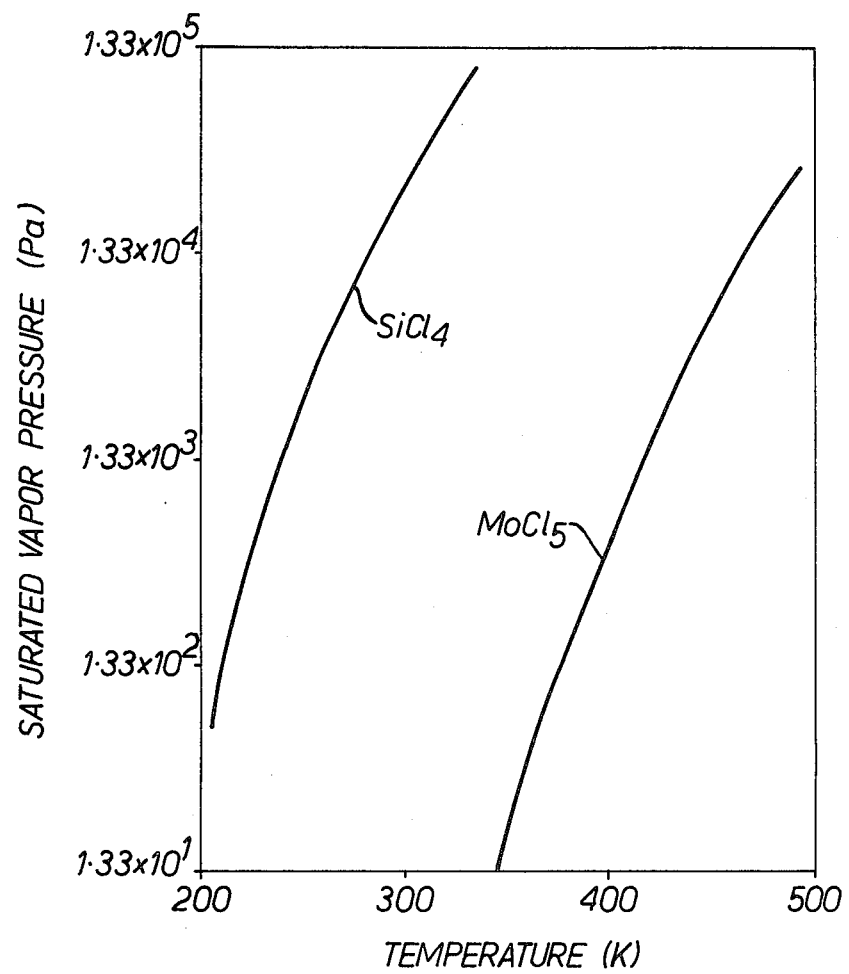
FIG. 3 is a graph showing saturated vapor pressures of silicon chloride and molybdenum chloride, at various temperatures.

In fact, in the case of both molybdenum and molybdenum silicide, the surface often becomes discolored to a light brown during the etching process and etching is halted. When Auger electron spectroscopy is performed on this discolored surface, large Mo and Cl signals are observed. From this result, it appears that the substances adhering to the surface and preventing etching are reaction products of molybdenum with chlorine, e.g., $MoCl_x$ (where x = 1-5). When the saturation vapor pressure of molybdenum chloride is measured, as shown in FIG. 3, it is much lower than that of $SiCl_4$, i.e., the molybdenum compound is relatively non-volatile. Therefore, since the reaction products of molybdenum and chlorine are essentially non-volatile, they will accumulate on the surface of the sample during etching. However, etching will still proceed satisfactorily if the rate of removal due to ion bombardment is higher than the rate of accumulation. The reason, in the case of etching with only $Cl_2$, why the surface becomes discolored and etching stops, is that the balance between the rates of accumulation and of removal due to ion bombardment is destroyed, the rate of accumulation being higher. A fact which supports this interpretation is that it is observed that re-deposition occurs more easily at higher pressures, i.e., a lower degree of ion bombardment. Especially in the case of molybdenum, re-deposition is observed to some extent in all of the pressure ranges shown in FIG. 2.

Figure 4A:
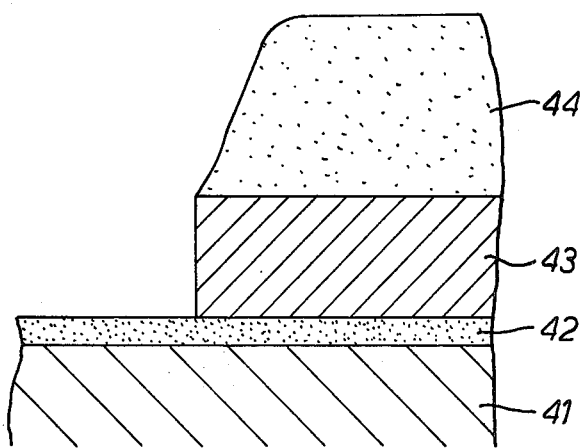
FIGS. 4A and 4B are sectional elevations of a sample including a layer of molybdenum silicide at two different stages of the reactive ion etching process, using chlorine alone as the etching gas.
Figure 4B:
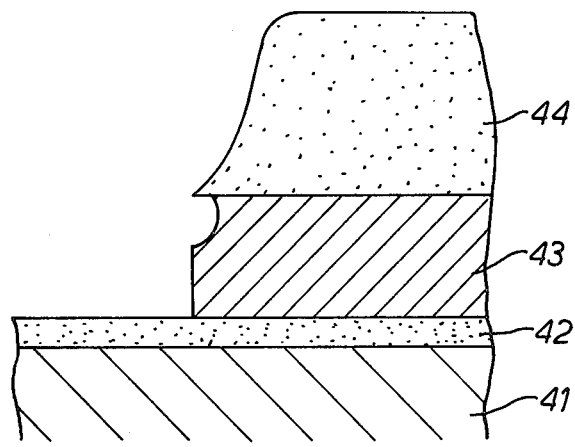

As inferred from the above investigation, the material which is re-deposited on the side wall of the molybdenum layer, preventing undercutting, is believed to be composed of reaction products (it essentially comprises $MoCl_5$). This is demonstrated by the following experimental results. As shown in FIG. 4A, the cross-sectional shape produced by etching of molybdenum silicide at a pressure of 20 Pa shows good anisotropy (vertical side walls). In FIG. 4A, a layer 43 of molybdenum silicide is deposited on a $SiO_2$ layer 42 covering the Si substrate 41. The layer of $MoSi_2$ is selectively covered by photoresist layer 44 in order to be selectively etched. After etching under the conditions shown in FIG. 4A, if the sample is then re-etched after heat treatment up to temperatures of about 473 K., the cross-sectional shape is as shown in FIG. 4B. The reason why the shape shown in FIG. 4B is produced is that the heat treatment removes the material that has been redeposited on the side wall in the first etching stage, so that undercutting occurs during the second etching.

Summarizing, the characteristics of the etching of molybdenum and molybdenum silicide using only $Cl_2$ gas as the etching gas are as follows.

(1) Although the cross-section shows excellent anistropy, this is due to the fact that undercutting is prevented by the non-volatile reaction product $MoCl_5$ deposited on the side walls.

(2) The etching does not progress because re-deposition frequently occurs on the surface.

There are both advantages and disadvantages in carrying out etching of molybdenum and molybdenum silicide using $Cl_2$ gas alone. It is therefore desirable to mitigate the disadvantages without losing the above advantages. In this respect it may be noted that if the gas mixture of $CF_4$ and $O_2$ is used as the etching gas so that the reaction product is, for example, $MoF_y$, reaction products with high saturated vapor pressure are produced so that redeposition does not occur. However, this does lead to undercutting.

Therefore, the method of the present invention utilizes the fact that the saturated vapor pressure of compounds of oxygen and chlorine with molybdenum ($MoO_xCl_y$) is comparatively high. That is, the reactive ion etching of present invention is performed using, as the etching gas, a mixture of $O_2$ and $Cl_2$ with the added condition that the $O_2$ gas flow rate is less than approximately 30% of the total flow rate of $Cl_2$ and $O_2$ together. Some of the reaction product is therefore of the form $MoO_xCl_y$.

Figure 5:
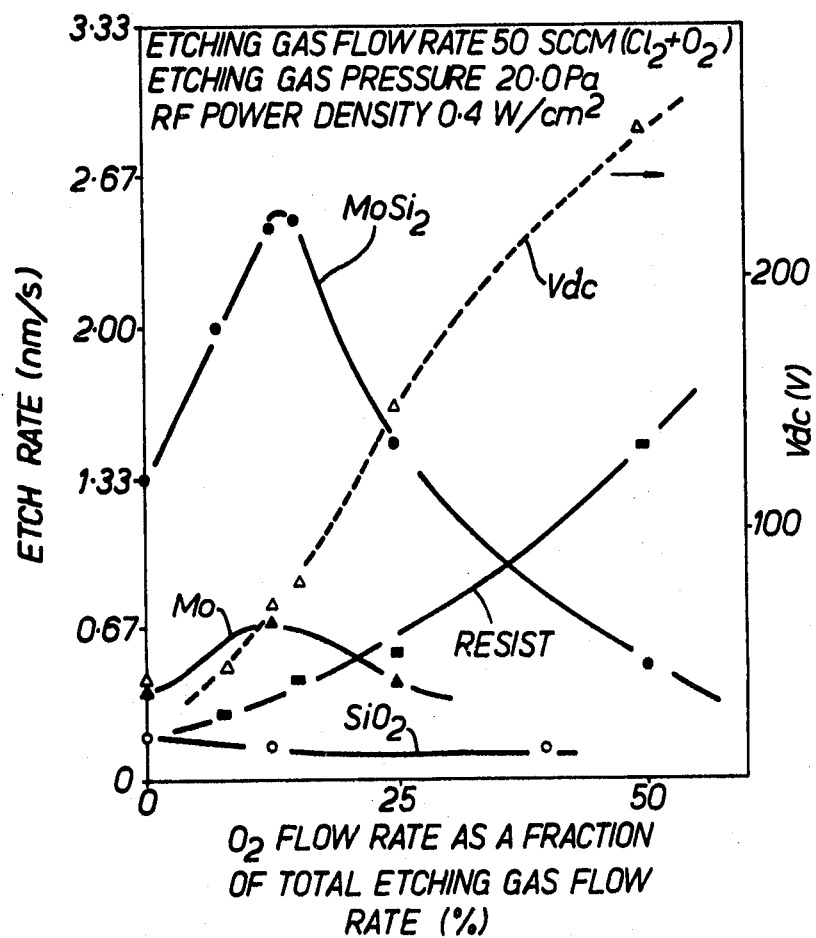
FIG. 5 is a graph showing etch rates of $SiO_2$, photoresist, and molybdenum and molybdenum silicide as a function of etching gas $O_2$ content, and also a curve of self-bias voltages, when a mixture of chlorine and oxygen is used as the etching gas.

Etching rates of $SiO_2$, photoresist, molybdenum and molybdenum silicide, as well as self-bias voltages $V_{dc}$, are shown in FIG. 5 using the mixture of $Cl_2$ and $O_2$ as the etching gas. Specifically, the etch rates of molybdenum and molybdenum silicide are rapidly increased by the addition of a small amount of $O_2$ gas. Under these conditions of $O_2$ addition, no interference with etching due to surface re-deposition is observed. When the amount of added $O_2$ is further increased, a decrease in the etch rate is observed because of oxidation of the surface. On the other hand, the etch rate of the resist steadily increases with increases of $O_2$. The etch rate of silicon dioxide ($SiO_2$) initially drops somewhat with increased $O_2$ gas flow, but it is thereafter practically constant. Because of these facts, in order to obtain sufficient etching selectivity between either resist or $SiO_2$ and either molybdenum or molybdenum silicide, it is necessary to add an amount of $O_2$ gas less than about 30% of the total amount of etching gas. As seen from FIG. 5, the etch rate of molybdenum or molybdenum silicide is adequate for practical use with the etching method described above.

It might be possible that changing some of the reaction product to the volatile $MoO_xCl_y$ would have the effect of producing undercutting by decreasing the amount of re-deposition on the side walls. In fact, under the conditions that the amount added of $O_2$ gas is more than about 10% of the total amount of gas, the pressure range in which satisfactory anisotropy appears is shifted somewhat to the low pressure side in comparison with etching with $Cl_2$ gas alone (FIG. 2). As mentioned above, if etching is carried out at extremely low pressures, the selectivity is lost. And from the viewpoint of the cross-sectional shape also, the amount of $O_2$ gas must be kept below about 30% of the total amount of gas flow.

According to present invention, the preferred flow rate of $O_2$ gas is in the range of about 5% to 20% of the total flow rate of etching gas in order to satisfy the conditions that, for example, the etch rate of molybdenum silicide ($MoSi_2$) is more than about 1.67 nm/s, etching selectivity ratio of $MoSi_2$ over the resist is more than about 3, etching selectivity ratio of $MoSi_2$ over $SiO_2$ is more than about 10, and etching is anisotropic with a vertical cross-section.

Figure 6:
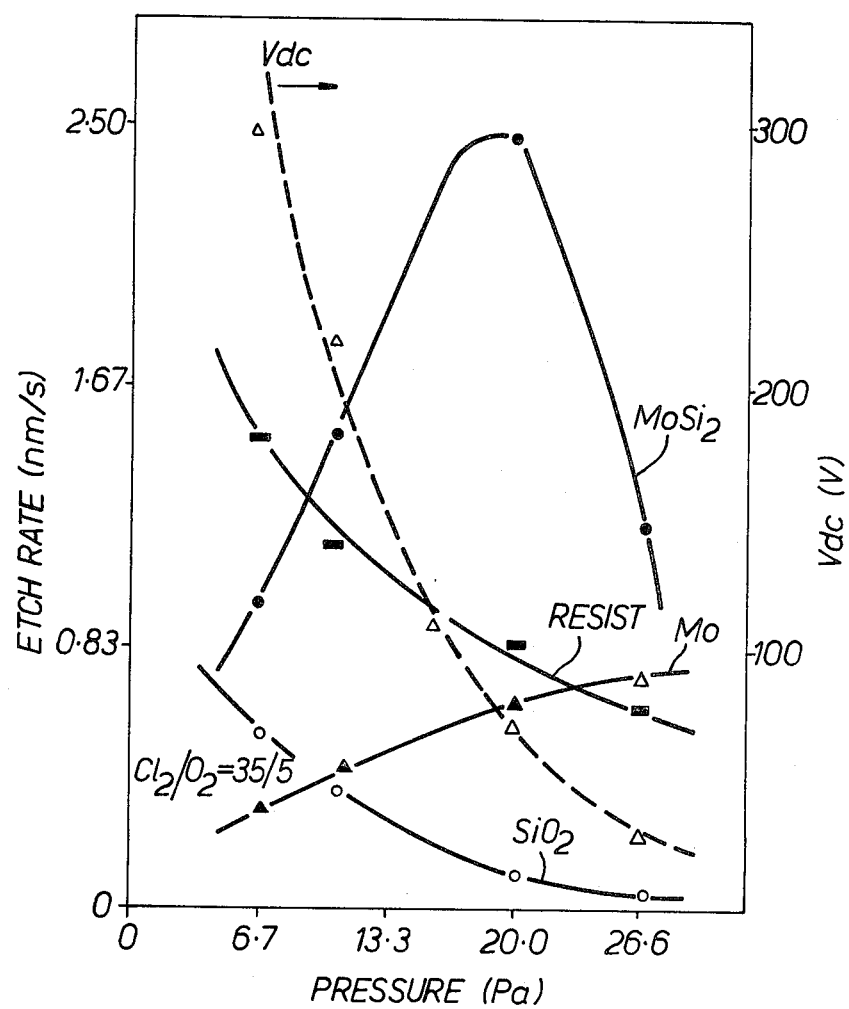
FIG. 6 is a graph showing etch rates of $SiO_2$, photoresist, molybdenum and molybdenum silicide as a function of pressure, and also a curve of self-bias voltages, when a mixture of chlorine and oxygen is used as the etching gas.

Although the method of the present invention is explained primarily with respect to the amount of added $O_2$ gas, the total gas pressure of the mixture of $Cl_2$ and $O_2$ also affects reactive ion etching. That is, while the etch rate of $MoSi_2$ is a maximum at a gas pressure of about 20.0 Pa (see FIG. 6), above about 30 Pa the etching rate becomes so small that it is not suitable for practical use. On the other hand, for gas pressures less than about 12.0 Pa the etching selectivity ratios of $MoSi_2$ over both $SiO_2$ and resist are too low. Therefore, the preferred range of gas pressure is about 12.0 to about 24.0 Pa.

According to the method of this invention, etching is performed using a mixture of $Cl_2$ and $O_2$ gas with the proportion of $O_2$ being less than approximately 30% of the total gas flow rate, thereby always obtaining a clean surface with no re-deposition and good etching reproducibility. Furthermore, a large selectivity ratio with respect to the resist mask and silicon dioxide film can be obtained, since a processing shape characteristic is obtained which has excellent anisotropy even at comparatively high pressures, in contrast to the etching of silicon.

As explained above, the method of the reactive ion etching according to this invention is extremely effective for fine working of semiconductor integrated circuits. It provides an excellent processing shape with a large etching selectivity ratio over both the resist mask and silicon dioxide, and also a satisfactory etching rate suitable for practical use.

I claim:

1. In a vacuum chamber including a pair of spaced electrodes, a method of reactive ion etching the surface of a sample mounted on one of the electrodes, the surface comprising molybdenum silicide, said method comprising the steps of:
   introducing into the vessel a mixture consisting of chlorine gas and oxygen gas, the flow rate of the oxygen gas being being less than about 30% of the total flow rate of the mixture; and
   generating a discharge between the electrodes by applying a high frequency voltage to the electrodes.

2. The method of claim 1 wherein the flow rate of the oxygen gas is in the range from about 5% to about 20% of the total flow rate of the mixture.

3. The method of claim 1 wherein the pressure of the mixture is in the range from about 12.0 Pa to about 24.0 Pa.

4. The method of claim 1 wherein silicon dioxide underlies the surface, said method having an etching selectivity ratio of molybdenum silicide over silicon dioxide of at least about 10.

5. In a vacuum chamber including a pair of spaced electrodes, a method of reactive ion etching the surface of a sample mounted on one of the electrodes, the surface comprising molybdenum, said method comprising the steps of:
   introducing into the vessel a mixture consisting of chlorine gas and oxygen gas, the flow rate of the oxygen gas being being less than about 30% of the total flow rate of the mixture; and
   generating a discharge between the electrodes by applying a high frequency voltage to the electrodes.

6. The method of claim 5 wherein the flow rate of the oxygen gas is in the range from about 5% to about 20% of the total flow rate of the mixture.

7. The method of claim 5 wherein the pressure of the mixture is in the range from about 12.0 Pa to about 24.0 Pa.

8. In a vacuum chamber including a pair of spaced electrodes, a method of reactive ion etching the surface of a sample mounted on one of the electrodes, the surface comprising molybdenum silicide and photoresist, said method having an etching selectivity ratio of molybdenum silicide over photoresist of at least about 3, said method comprising the steps of:

introducing into the vessel a mixture consisting of chlorine gas and oxygen gas, the flow rate of the oxygen gas being being less than about 30% of the total flow rate of the mixture; and generating a discharge between the electrodes by applying a high frequency voltage to the electrodes.

* * * * *